United States Patent
Wu et al.

(10) Patent No.: US 9,076,819 B2
(45) Date of Patent: Jul. 7, 2015

(54) CONTACT STRUCTURE OF SEMICONDUCTOR DEVICE

(71) Applicant: TAIWAN SEMICONDUCTOR MANUFACTURING COMPANY, LTD., Hsinchu (TW)

(72) Inventors: Cheng-Hsien Wu, Hsinchu (TW); Chih-Hsin Ko, Fongshan (TW); Clement Hsingjen Wann, Carmel, NY (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/221,406

(22) Filed: Mar. 21, 2014

(65) Prior Publication Data
US 2014/0206167 A1 Jul. 24, 2014

Related U.S. Application Data

(62) Division of application No. 13/428,972, filed on Mar. 23, 2012, now Pat. No. 8,716,765.

(51) Int. Cl.
*H01L 21/336* (2006.01)
*H01L 29/66* (2006.01)
(Continued)

(52) U.S. Cl.
CPC .......... *H01L 29/66636* (2013.01); *H01L 29/78* (2013.01); *H01L 29/4966* (2013.01);
(Continued)

(58) Field of Classification Search
CPC .................. H01L 29/66636; H01L 29/7848
USPC .......... 438/197–199, 230, 299–300, 429, 478, 438/595, 607; 257/192, 288, E29.255
See application file for complete search history.

(56) References Cited

U.S. PATENT DOCUMENTS 6,613,641 B1 9/2003 Volant et al.
7,154,118 B2 12/2006 Lindert et al.
(Continued)

FOREIGN PATENT DOCUMENTS

JP 3873133 11/2006
KR 1020000033433 6/2000
(Continued)

OTHER PUBLICATIONS

Connelly, Daniel, et al., "A New Route to Zero-Barrier Metal Source/Drain Mosfets", IEEE Transactions on Nanotechnology, vol. 3, No. 1, Mar. 2004, pp. 98-104.
(Continued)

*Primary Examiner* — Dung Le
(74) *Attorney, Agent, or Firm* — Lowe Hauptman & Ham, LLP

(57) ABSTRACT

A method of fabricating a semiconductor device comprises epitaxially-growing a strained material in a cavity of a substrate comprising a major surface and the cavity, the cavity being below the major surface. A lattice constant of the strained material is different from a lattice constant of the substrate. The method also comprises forming a first metal layer over the strained material, and forming a dielectric layer over the first metal layer, wherein the dielectric layer has a thickness ranging from 1 nm to 10 nm. The method further comprises forming a dummy poly-silicon over the dielectric layer, and forming an interlayered dielectric layer (ILD) surrounding the dummy poly-silicon. The method additionally comprises removing the dummy poly-silicon over the dielectric layer, and forming a second metal layer over the dielectric layer.

20 Claims, 12 Drawing Sheets

(51) Int. Cl.
- *H01L 29/78* (2006.01)
- *H01L 29/49* (2006.01)
- *H01L 29/51* (2006.01)
- *H01L 29/165* (2006.01)
- *H01L 21/02* (2006.01)
- *H01L 29/417* (2006.01)

(52) U.S. Cl.
CPC ........ *H01L29/517* (2013.01); *H01L 29/66545* (2013.01); *H01L 29/7848* (2013.01); *H01L 29/165* (2013.01); *H01L 21/02609* (2013.01); *H01L 29/41791* (2013.01); *H01L 29/785* (2013.01); *H01L 2924/0002* (2013.01)

(56) References Cited

U.S. PATENT DOCUMENTS

| | | |
|---|---|---|
| 2008/0265417 A1 | 10/2008 | Kawamura et al. |
| 2009/0032844 A1 | 2/2009 | Ogura et al. |
| 2012/0043623 A1 | 2/2012 | Doris et al. |
| 2012/0056245 A1 | 3/2012 | Kang et al. |
| 2012/0190160 A1 | 7/2012 | Chen et al. |
| 2013/0020612 A1* | 1/2013 | Wann et al. ................... 257/190 |
| 2013/0082337 A1 | 4/2013 | Chudzik et al. |
| 2013/0113027 A1 | 5/2013 | Chiang et al. |
| 2013/0171794 A1 | 7/2013 | Pei et al. |
| 2013/0248999 A1* | 9/2013 | Glass et al. ................... 257/335 |

FOREIGN PATENT DOCUMENTS

| | | |
|---|---|---|
| KR | 1020050065092 | 6/2005 |
| KR | 10-0845175 | 7/2008 |

OTHER PUBLICATIONS

Yuan, Ze, et al., "Schottky Barrier Height Reduction for Metal/n-GaSb Contact by Inserting TiO2 Interfacial Layer with Low Tunneling Resistance", Applied Physics Letters 98, 172106 (2011).

Lin, J.-Y. Jason, et al., "Increase in Current Density for Metal Contacts to N-Germanium by Inserting TiO2 Interfacial Layer to Reduce Schottky Barrier Height", Applied Physics Letters 98, 092113 (2011).

Notice of Allowance dated Dec. 19, 2013 and English translation from corresponding application No. KR 10-2012-0080042.

Office Action dated Aug. 11, 2014 from corresponding No. TW 101126906.

* cited by examiner

CONTACT STRUCTURE OF SEMICONDUCTOR DEVICE

PRIORITY CLAIM

The present application is a divisional of U.S. application Ser. No. 13/428,972, filed Mar. 23, 2012, the disclosure of which is incorporated by reference herein in its entirety.

TECHNICAL FIELD

This disclosure relates to integrated circuit fabrication, and more particularly to a semiconductor device with a contact structure.

BACKGROUND

As the semiconductor industry has progressed into nanometer technology process nodes in pursuit of higher device density, higher performance, and lower costs, challenges from both fabrication and design issues have resulted in the development of three-dimensional designs of a semiconductor device, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over three sides (e.g., wrapping) the fin. Having a gate on both sides of the channel allows gate control of the channel from both sides. Further advantages of FinFET comprise reducing the short channel effect and higher current flow.

However, there are challenges to implementation of such features and processes in complementary metal-oxide-semiconductor (CMOS) fabrication. For example, silicide formation on strained materials consumes a portion of the strained material. The remaining strained material may not deliver sufficient amount of strain into channel region of the semiconductor device, resulting in an insufficient on-current of the semiconductor device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
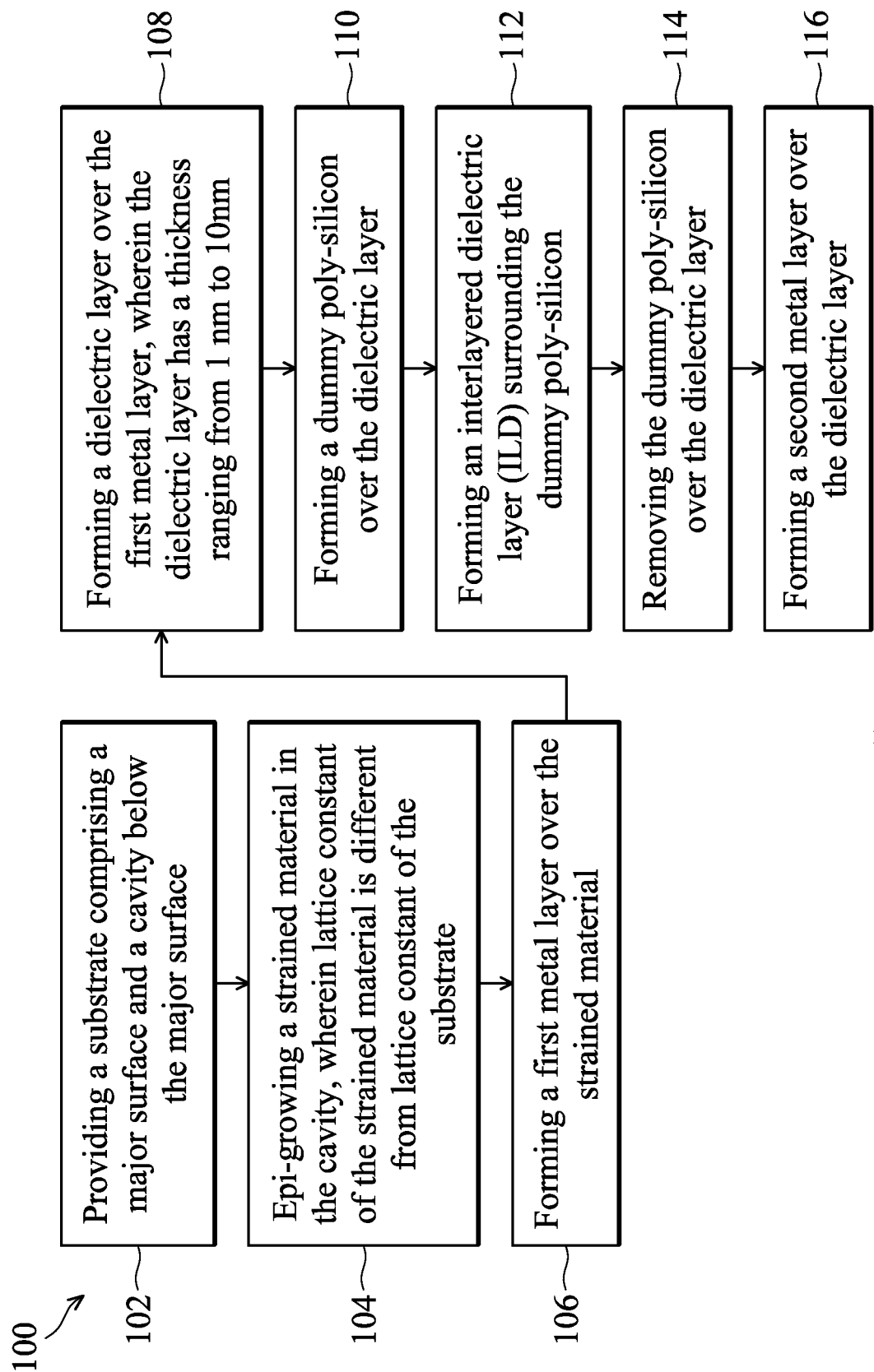
FIG. 1 is a flowchart illustrating a method of fabricating a contact structure of a semiconductor device according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a contact structure of a semiconductor device according to various aspects of the present disclosure. The method 100 begins with step 102 in which a substrate comprising a major surface and a cavity below the major surface is provided. The method 100 continues with step 104 in which a strained material is epitaxially-grown in the cavity, wherein the lattice constant of the strained material is different from the lattice constant of the substrate. The method 100 continues with step 106 in which a first metal layer is formed over the strained material. The method 100 continues with step 108 in which a dielectric layer is formed over the first metal layer, wherein the dielectric layer has a thickness ranging from 1 nm to 10 nm. The method 100 continues with step 110 in which a dummy poly is formed over the dielectric layer. The method 100 continues with step 112 in which an interlayer dielectric layer (ILD) is formed surrounding the dummy poly. The method 100 continues with step 114 in which the dummy poly over the dielectric layer is removed. The method 100 continues with step 116 in which a second metal layer is formed over the dielectric layer. The discussion that follows illustrates embodiments of semiconductor devices that can be fabricated according to the method 100 of FIG. 1.

FIGS. 2-12 are schematic cross-sectional views of a semiconductor device 200 comprising a contact structure 240 at various stages of fabrication according to various aspects of the present disclosure. As employed in the present disclosure, the term semiconductor device 200 refers to a fin field effect transistor (FinFET). The FinFET refers to any fin-based, multi-gate transistor. In some alternative embodiments, the term semiconductor device 200 refers to a planar metal-oxide-semiconductor field effect transistor (MOSFET). The semiconductor device 200 may be included in a microprocessor, memory cell, and/or other integrated circuit (IC). It is noted that, in some embodiments, the performance of the operations mentioned in FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and/or after the method 100 of FIG. 1, and that some other processes may only be briefly described herein. Also, FIGS. 2 through 12 are simplified for a better understanding of the concepts of the present disclosure. For example, although the figures illustrate the semiconductor device 200, it is understood the IC may comprise a number of other devices comprising resistors, capacitors, inductors, fuses, etc.

Figure 2:
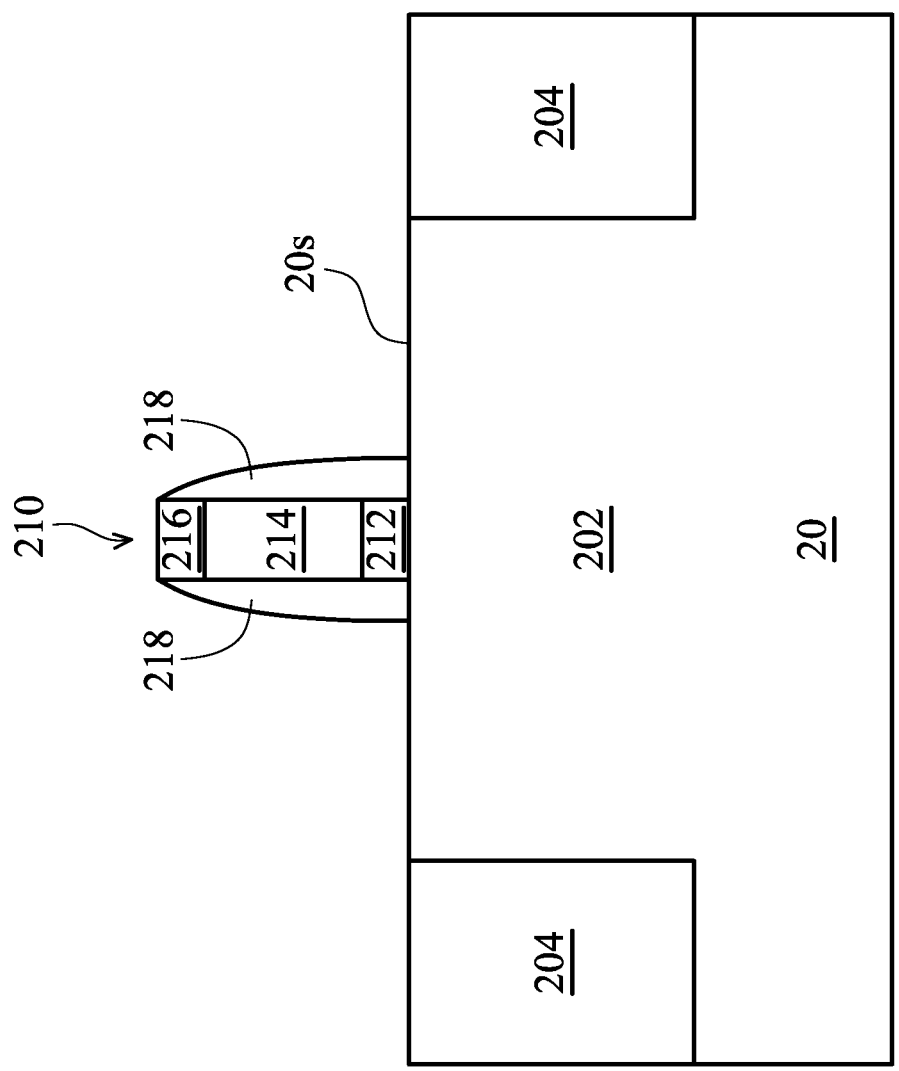
FIGS. 2-12 are schematic cross-sectional views of a semiconductor device comprising a contact structure at various stages of fabrication according to various aspects of the present disclosure.

Referring to FIG. 2 and step 102 in FIG. 1, a substrate 20 comprising a major surface 20s is provided. In at least one embodiment, the substrate 20 comprises a crystalline silicon substrate (e.g., wafer). The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET or planar MOSFET, or alternatively configured for a p-type FinFET or planar MOSFET.

The substrate 20 may alternatively be made of some other suitable elementary semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure.

In the depicted embodiment, the substrate 20 further comprises a fin structure 202. The fin structure 202, formed on the substrate 20, comprises one or more fins. In the present embodiment, for simplicity, the fin structure 202 comprises a single fin. The fin comprises any suitable material, for example, the fin may comprise silicon, germanium or compound semiconductor. The fin structure 202 may further comprise a capping layer disposed on the fin, which may be a silicon-capping layer.

The fin structure 202 is formed using any suitable process comprising various deposition, photolithography, and/or etching processes. An exemplary photolithography process may include forming a photoresist layer (resist) overlying the substrate 20 (e.g., on a silicon layer), exposing the resist to a pattern, performing a post-exposure bake process, and developing the resist to form a masking element including the resist. The silicon layer may then be etched using reactive ion etching (RIE) processes and/or other suitable processes. In an example, silicon fins of the fin structure 202 may be formed using patterning and etching a portion of the silicon substrate 20. In another example, silicon fins of the fin structure 202 may be formed using patterning and etching a silicon layer deposited overlying an insulator layer (for example, an upper silicon layer of a silicon-insulator-silicon stack of an SOI substrate).

In the depicted embodiment, isolation regions are formed within the substrate 20 to define and electrically isolate the various fins of the fin structure 202. In one example, the isolation regions include shallow trench isolation (STI) regions 204. The isolation regions may comprise silicon oxide, silicon nitride, silicon oxynitride, fluoride-doped silicate glass (FSG), a low-K dielectric material, and/or combinations thereof. The isolation regions, and in the present embodiment, the STI regions 204, may be formed by any suitable process. As one example, the formation of the STI regions 204 may include filling trenches between the fins (for example, using a chemical vapor deposition process) with a dielectric material. In some embodiments, the filled trench may have a multi-layer structure such as a thermal oxide liner layer filled with silicon nitride or silicon oxide.

Still referring to FIG. 2, a dummy gate stack 210 is formed on the major surface 20s of the substrate 20 (i.e., a top surface of the fin structure 202) in between the STI 204 regions. In the depicted embodiment, the dummy gate stack 210 comprises a gate dielectric layer 212 and a dummy gate electrode layer 214. The dummy gate stack 210 may be formed using any suitable process, including the processes described herein.

In one example, the gate dielectric layer 212 and dummy gate electrode layer 214 are sequentially deposited over the substrate 20. In some embodiments, the gate dielectric layer 212 may include silicon oxide, silicon nitride, silicon oxynitride, or high dielectric constant (high-k) dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu or mixtures thereof. In the present embodiment, the gate dielectric layer 212 is a high-k dielectric layer with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structure 202. The interfacial layer may comprise silicon oxide.

In some embodiments, the dummy gate electrode layer 214 may comprise a single layer or multilayer structure. In the present embodiment, the dummy gate electrode layer 214 may comprise poly-silicon. Further, the dummy gate electrode layer 214 may be doped poly-silicon with the uniform or non-uniform doping. In the present embodiment, the dummy gate electrode layer 214 comprises a thickness in the range of about 30 nm to about 60 nm. The dummy gate electrode 214 may be formed using a low-pressure chemical vapor deposition (LPCVD) process or a plasma-enhanced chemical vapor deposition (PECVD) process.

Then, a layer of photoresist is formed over the dummy gate electrode layer 214 by a suitable process, such as spin-on coating, and patterned to form a patterned photoresist feature by a proper lithography patterning method. In at least one embodiment, a width of the patterned photoresist feature is in the range of about 15 to 45 nm. The patterned photoresist feature can then be transferred using a dry etching process to the underlying layers (i.e., the dummy gate electrode layer 214 and the gate dielectric layer 212) to form the dummy gate stack 210. The photoresist layer may be stripped thereafter.

In another example, a hard mask layer 216 is formed over the dummy gate electrode layer 214; a patterned photoresist layer is formed on the hard mask layer 216; and the pattern of the photoresist layer is transferred to the hard mask layer 216 and then transferred to the dummy gate electrode layer 214 and the gate dielectric layer 212 to form the dummy gate stack 210. The hard mask layer 216 comprises silicon oxide. In some alternative embodiments, the hard mask layer 216 may optionally comprise silicon nitride, silicon oxynitride, and/or other suitable dielectric materials, and may be formed using a method such as CVD or PVD. The hard mask layer 216 comprises a thickness in the range from about 100 to 800 angstroms.

Still referring to FIG. 2, the semiconductor device 200 further comprises a dielectric layer formed over the dummy gate stack 210 and the substrate 20 and covering sidewalls of the dummy gate stack 210. The dielectric layer may include silicon oxide, silicon nitride, or silicon oxy-nitride. The dielectric layer may comprise a single layer or multilayer structure. The dielectric layer may be formed by CVD, PVD, ALD, or other suitable technique. The dielectric layer comprises a thickness ranging from about 5 to 15 nm. Then, an anisotropic etching is performed on the dielectric layer to form a pair of sidewall spacers 218 on two sides of the dummy gate stack 210.

Figure 3:
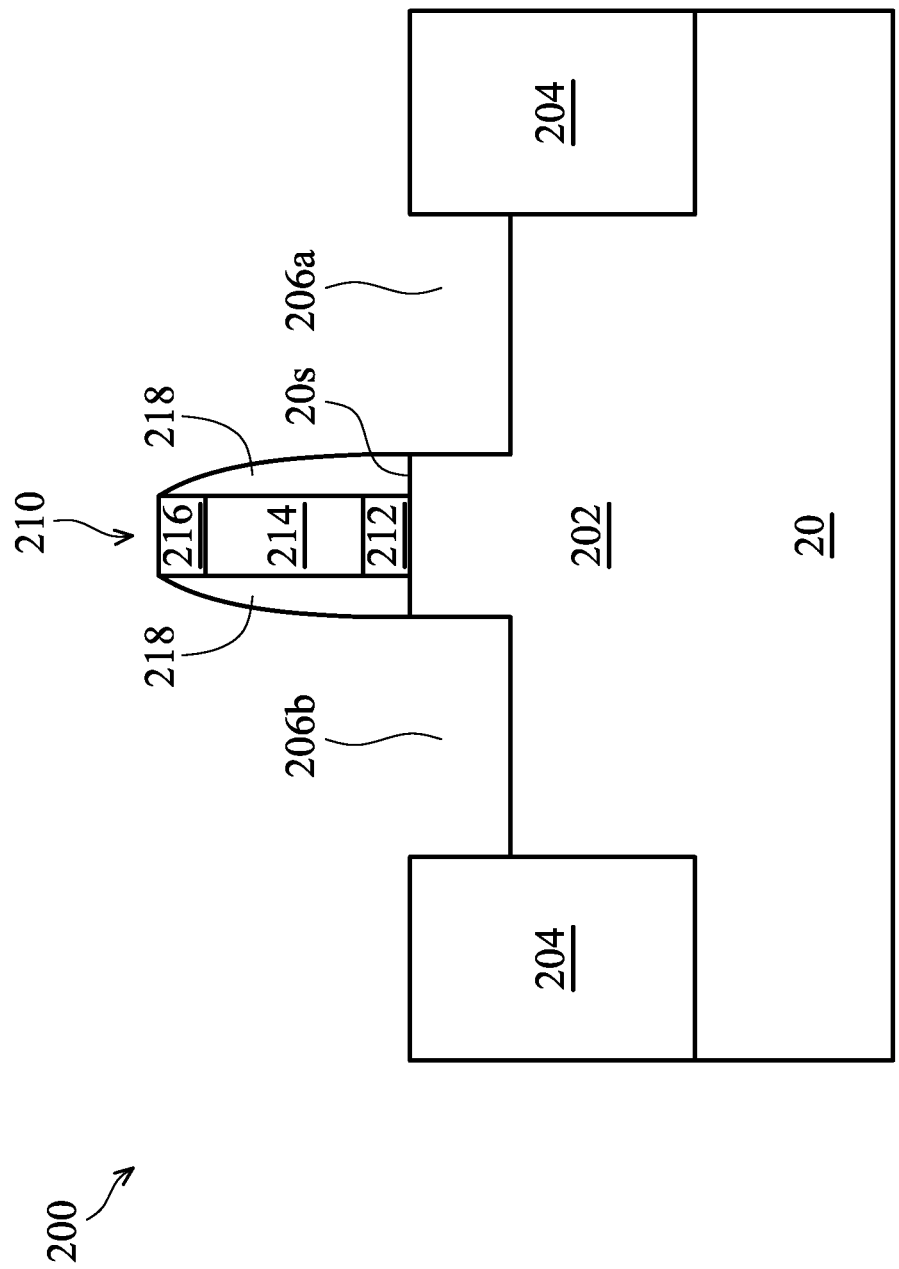

Referring to FIG. 3 and step 102 in FIG. 1, portions of the fin structure 202 (other than where the dummy gate stack 210 and the pair of sidewall spacers 218 are formed thereover) are recessed to form source and drain (S/D) cavities 206 (comprising 206s and 206d) having bottom surfaces lower than the major surface 20s of the substrate 20. In the depicted embodiment, each cavity 206a or 206b is between the dummy gate stack 210 and one of the STI 204 regions.

In the depicted embodiment, using the dummy gate stack 210 and the pair of sidewall spacers 218 as hard masks, a biased etching process is performed to recess the major surface 20s of the substrate 20 that are unprotected or exposed to form the S/D cavities 206. In one embodiment, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in the embodiments provided, the bias voltage used in the etching process may be tuned to allow better control of an etching direction to achieve desired profiles for the S/D cavities 206.

Figure 4:
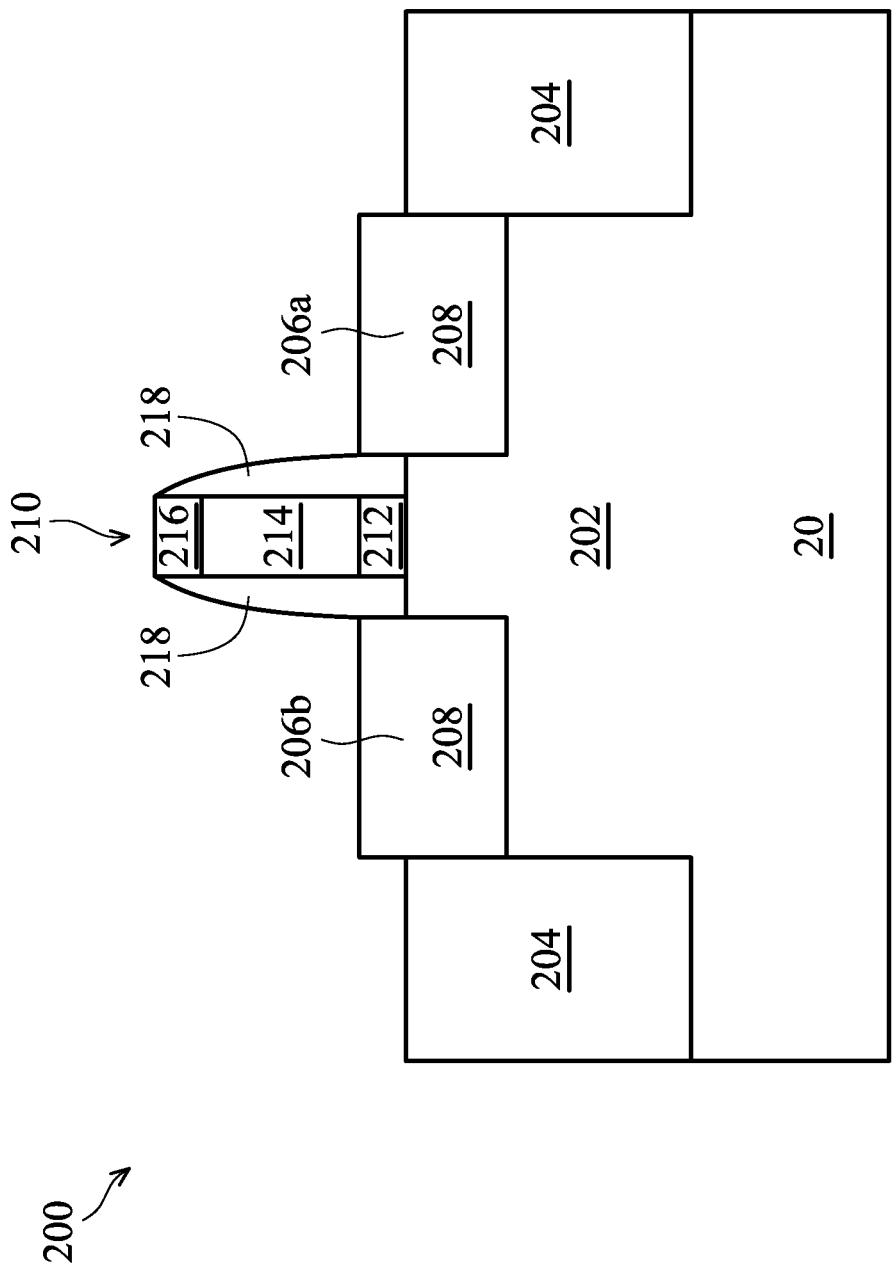

As depicted in FIG. 4 and step 104 in FIG. 1, after the formation of the source and drain (S/D) cavities 206 below the major surface 20s of the substrate 20, the structure in FIG. 4 is produced by epi-growing a strained material 208 in the cavities 206 distributed between the gate stack 210 and the STI 204 regions, wherein the lattice constant of the strained material 208 is different from the lattice constant of the substrate 20. Thus, the channel region of the semiconductor device 200 is strained or stressed to enhance carrier mobility of the device.

In some embodiments, the strained material 208 comprises a silicon-containing material such as SiGe, SiC, or SiP. In some embodiments, the strained material 208 comprises a dislocation. In the depicted embodiment, a pre-cleaning process may be performed to clean the S/D recess cavities 206 with HF or other suitable solution. Then, the strained material 208 such as silicon germanium (SiGe) is selectively grown by an LPCVD process to fill the S/D recess cavities 206 in the substrate 20. In one embodiment, an upper surface of the strained material 208 is lower than the major surface 20s (not shown). In another embodiment, the upper surface of the strained material 208 extends upward over the major surface 20s. In the depicted embodiment, the LPCVD process is performed at a temperature of about 400 to 800° C. and under a pressure of about 1 to 15 Torr, using $SiH_2Cl_2$, HCl, $GeH_4$, $B_2H_6$, and $H_2$ as reaction gases, wherein a ratio of a mass flow rate of the $SiH_2Cl_2$ to a mass flow rate of the HCl is in the range of about 0.45 to 0.55.

The process steps up to this point have provided the strained material 208 in the cavities 206 distributed between the dummy gate stack 210 and the STI 204 regions. In some applications, silicide regions over the strained material 208 may be formed by blanket depositing a thin layer of metal material, such as nickel, titanium, cobalt, and combinations thereof. The substrate 20 is then heated, which causes silicon to react with the metal where contacted. After the reaction, a layer of metal silicide is formed between the silicon-containing material and the metal. The un-reacted metal is selectively removed through the use of an etchant that attacks the metal material but does not attack silicide.

However, the formation of silicide regions may consume a portion of the strained material 208. Thus, the remaining strained material 208 in the cavities 206 may not deliver sufficient amount of strain into channel region of the semiconductor device, resulting in an insufficient on-current of the semiconductor device. Further, resistance of the silicide regions will abruptly increase if the contact area becomes smaller in nanometer technologies, thereby degrading the device performance.

Accordingly, the processing discussed below with reference to FIGS. 5-12 may form a contact structure comprising a conductive dielectric layer to replace the silicide regions. The contact structure will not consume the strained material 208, thereby delivering sufficient amount of strain into channel region of the semiconductor device. Problems associated with insufficient on-current of a semiconductor device may be avoided, thereby enhancing the device performance.

Figure 5:
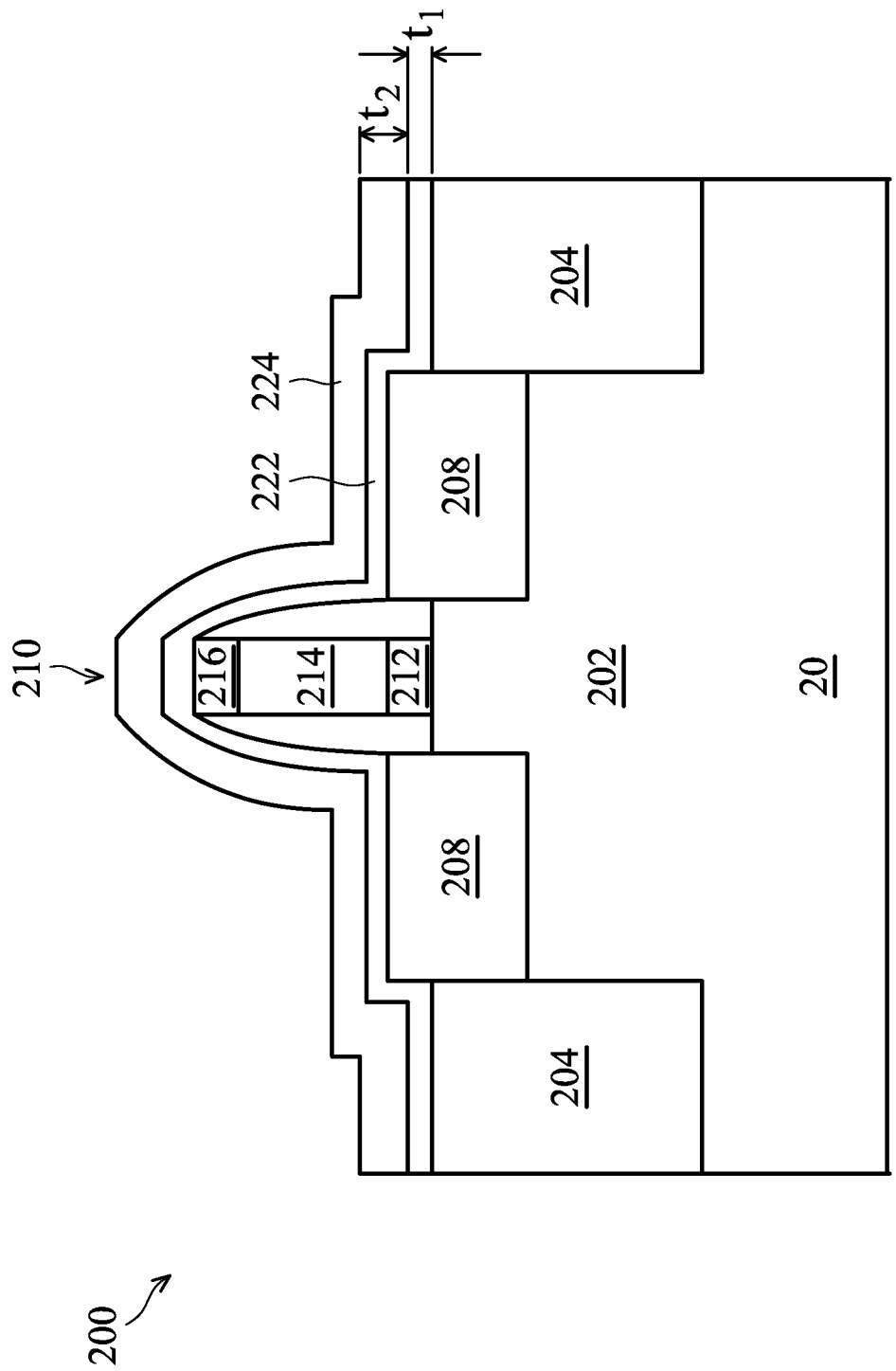

As depicted in FIG. 5 and step 106 in FIG. 1, for fabricating a contact structure (such as a contact structure 240 shown in FIG. 12) of the semiconductor device 200, the structure in FIG. 5 is produced by forming a first metal layer 222 over the strained material 208, dummy gate stack 210, and STI regions 204. In some embodiments, the first metal layer 222 may comprise TiN or TaN, and may be formed using a method such as CVD, ALD or sputtering. In some embodiments, the first metal layer 222 has a thickness $t_1$ ranging from 1 nm to 3 nm.

Then, as depicted in FIG. 5 and step 108 in FIG. 1, a conductive dielectric layer 224 is formed over the first metal layer 222. In at least one embodiment, the conductive dielectric layer 224 comprises $TiO_2$. In some alternative embodiments, the conductive dielectric layer 224 may optionally comprise $Al_2O_3$, NiO, or $HfO_2$ and/or other suitable dielectric materials, and may be formed using a method such as CVD, ALD, or sputtering. In some embodiments, the conductive dielectric layer 224 has a thickness $t_2$ ranging from 1 nm to 10 nm.

Figure 6:
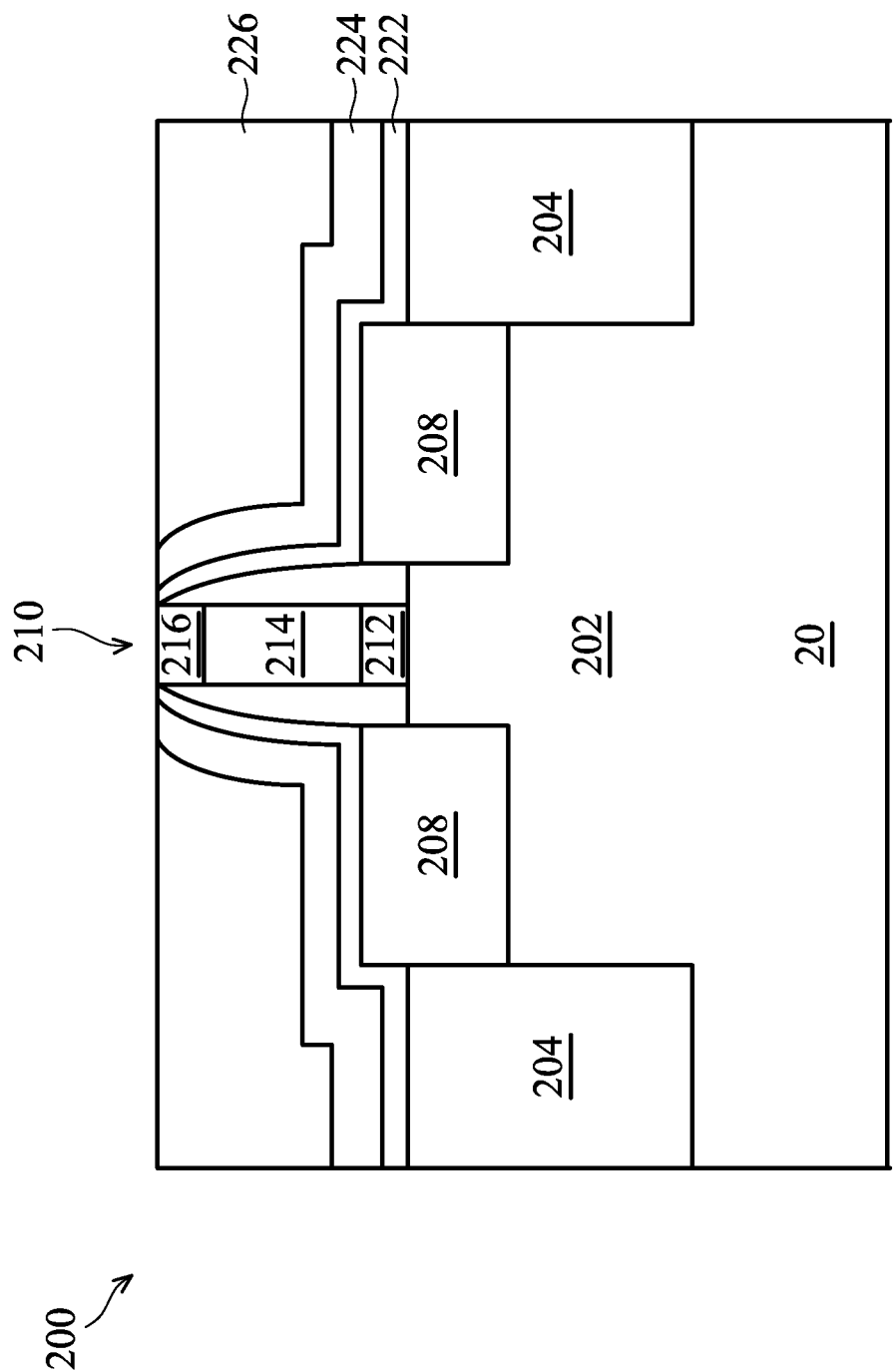

In order to form an interconnection to the conductive dielectric layer 224, as depicted in FIG. 6 and step 110 in FIG. 1, the structure in FIG. 6 is produced by forming a dummy poly-silicon 226 over the conductive dielectric layer 224. In some embodiments, the dummy poly-silicon 226 may comprise a single layer or multilayer structure. In some embodiments, the dummy poly-silicon 226 may be doped polysilicon with the uniform or non-uniform doping. In the present embodiment, the dummy poly-silicon 226 comprises a thickness in the range of about 30 nm to about 60 nm. The dummy poly-silicon 226 may be formed using a LPCVD process or a PECVD process. A chemical mechanical polishing (CMP) is performed on the dummy poly-silicon 226 to expose the dummy gate stack 210.

Figure 7:
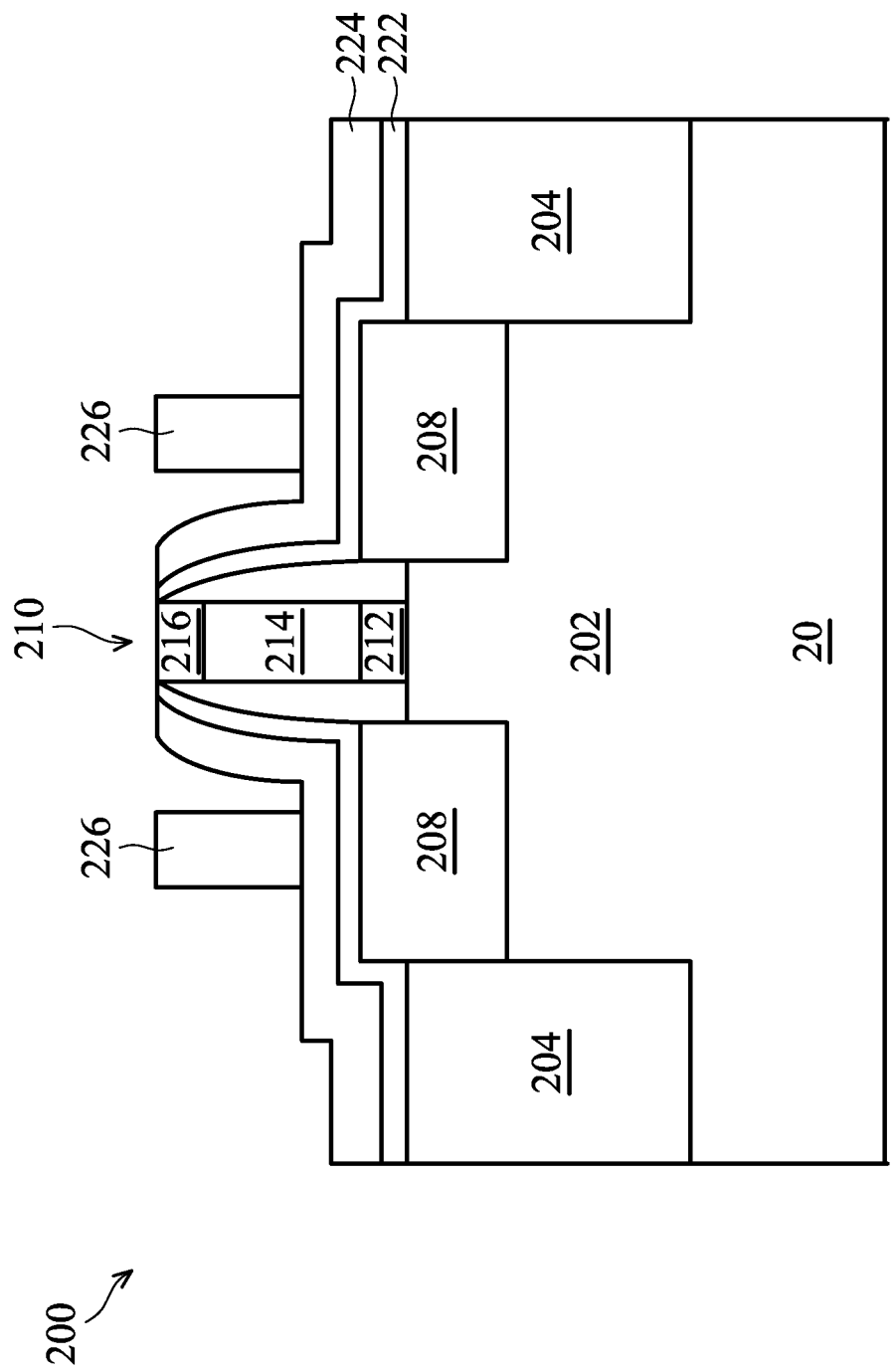

A layer of photoresist is formed over the dummy poly-silicon 226 by a suitable process, such as spin-on coating, and patterned to form a patterned photoresist feature by a proper lithography patterning method. In one embodiment, a width of the patterned photoresist feature is in the range of about 15 to 45 nm. The patterned photoresist feature can then be transferred using a dry etching process to the underlying dummy poly-silicon 226 (as depicted in FIG. 7 and step 110 in FIG. 1). The photoresist layer may be stripped thereafter.

Figure 8:
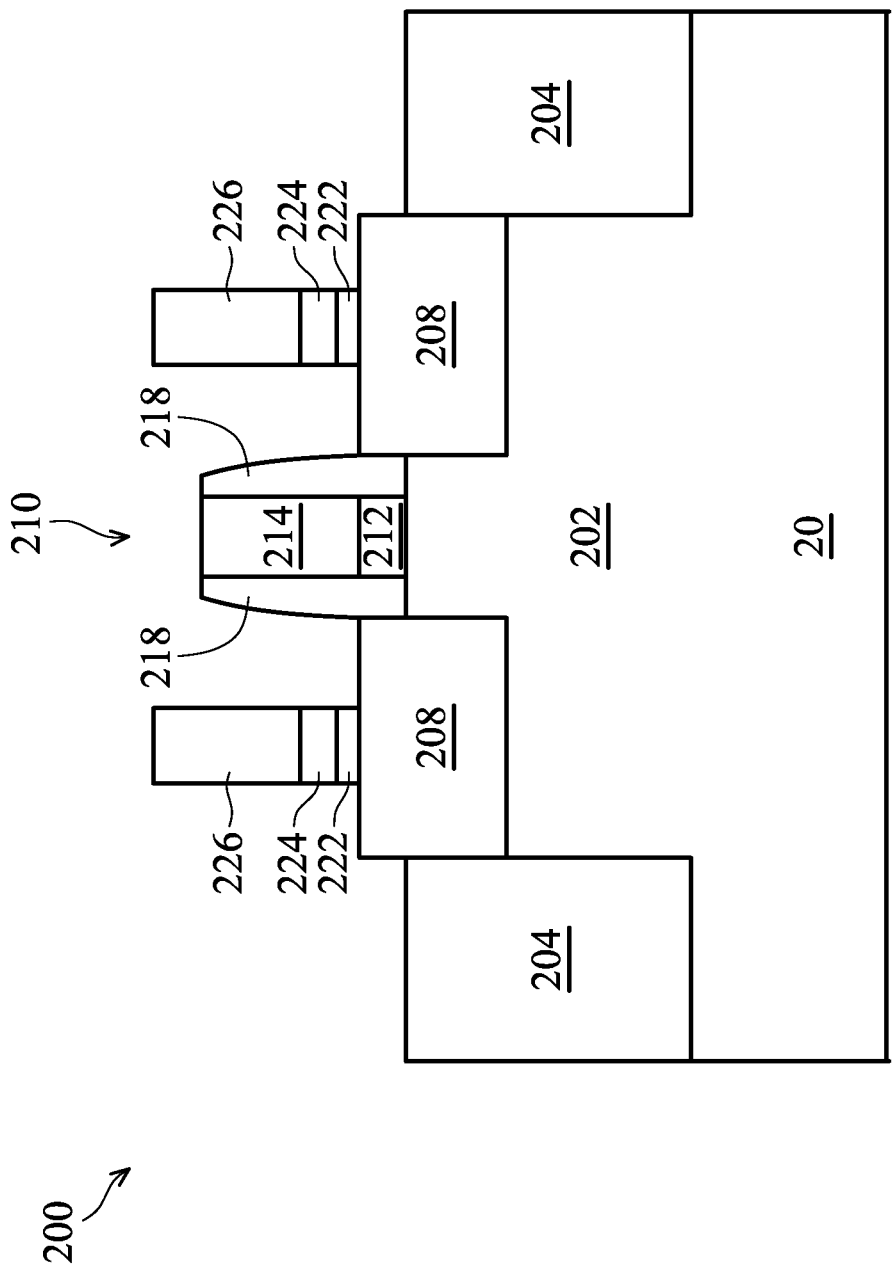

Referring to FIG. 8, subsequent to the formation of the dummy poly-silicon 226 over the conductive dielectric layer 224, using the dummy poly-silicon 226 as a hard mask, the layers (i.e., the conductive dielectric layer 224 and first metal layer 222) on the pair of sidewall spacers 218 are removed by a dry etching process until exposing a top surface of the strained material 208. In the depicted embodiment, the step of removing the conductive dielectric layer 224 and first metal layer 222 simultaneously removes the hard mask layer 216 on the dummy gate electrode 214. The remaining conductive dielectric layer 224 and first metal layer 222 may serve as a low-resistance intermediate layer to replace high-resistance silicide regions, thereby help carrier transport between the strained material 208 and a second metal layer 228 (shown in FIG. 12).

Figure 9:
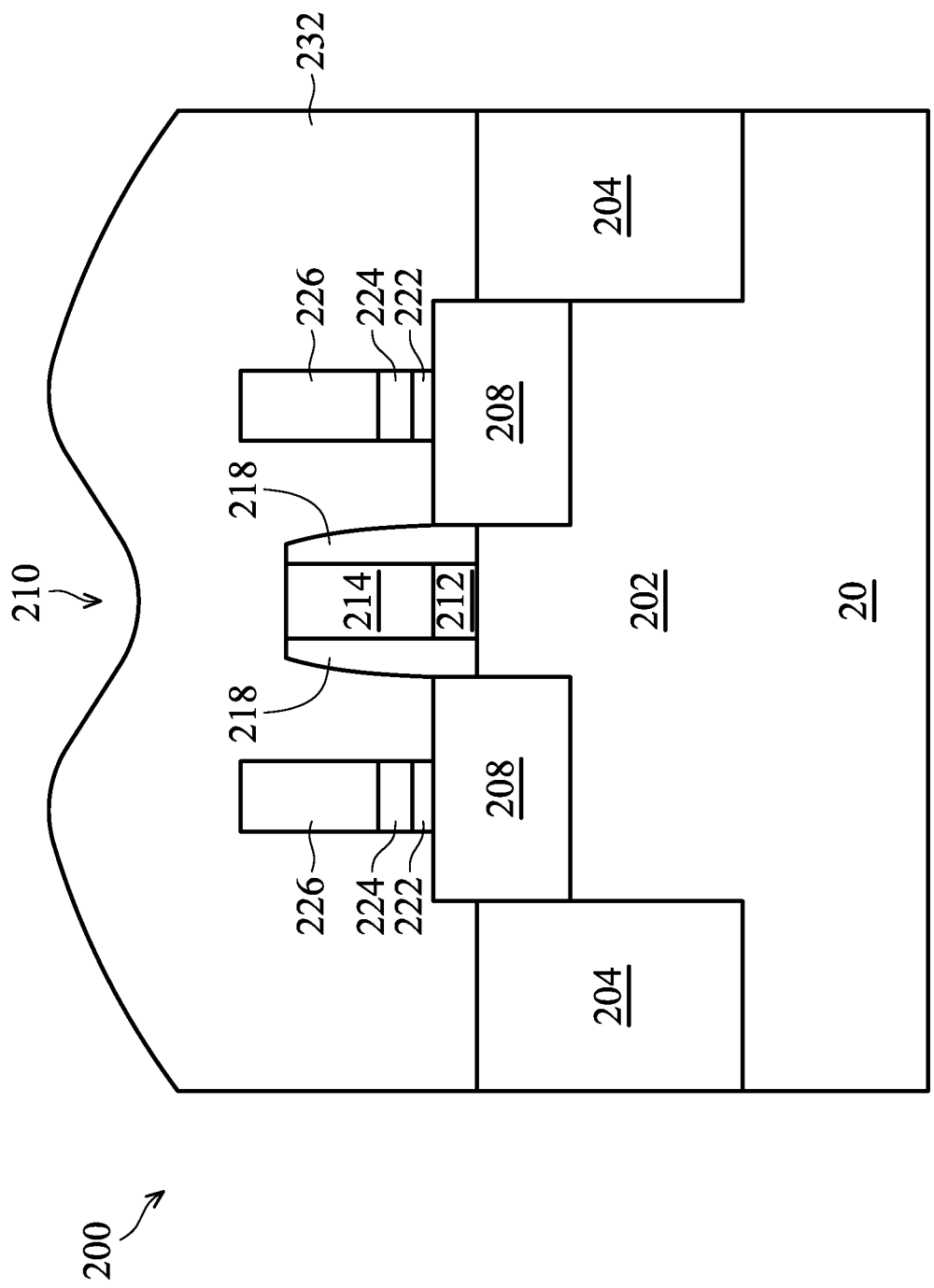

Referring to FIG. 9 and step 112 in FIG. 1, after removal of the layers (i.e., the conductive dielectric layer 224 and first metal layer 222) on the pair of sidewall spacers 218, an inter-layer dielectric (ILD) layer 232 may be formed over the dummy gate stack 210, the pair of sidewall spacers 218, the dummy poly-silicon 226, and extending over the substrate 20. The ILD layer 232 may comprise a dielectric material. The dielectric material may comprise silicon oxide, spin-on glass (SOG), fluorinated silica glass (FSG), carbon doped silicon oxide (e.g., SiCOH), BLACK DIAMOND® (APPLIED MATERIALS of Santa Clara, Calif.), other suitable dielectric materials, and/or combinations thereof. In some embodiments, the ILD layer 232 may include a high density plasma (HDP) dielectric material and/or a high aspect ratio process (HARP) dielectric material. In the present embodiment, the ILD layer 232 comprises a thickness in the range of about 4000 Å to about 8000 Å. It is understood that the ILD layer 232 may comprise one or more dielectric materials and/or one or more dielectric layers.

Subsequently, the ILD layer 232 may be planarized by a CMP process until a top surface of the dummy gate electrode layer 214 is exposed (shown in FIG. 10). The CMP process may have a high selectivity to provide a substantially planar surface for the dummy gate electrode layer 214, the pair of sidewall spacers 218, dummy poly-silicon 226, and ILD layer 232. In one embodiment, the dummy gate stack 210 may be surrounded with dielectric comprising the pair of sidewall spacers 218 and ILD layer 232. In another embodiment, the ILD layer 232 is surrounding the dummy poly-silicon 226.

Figure 10:
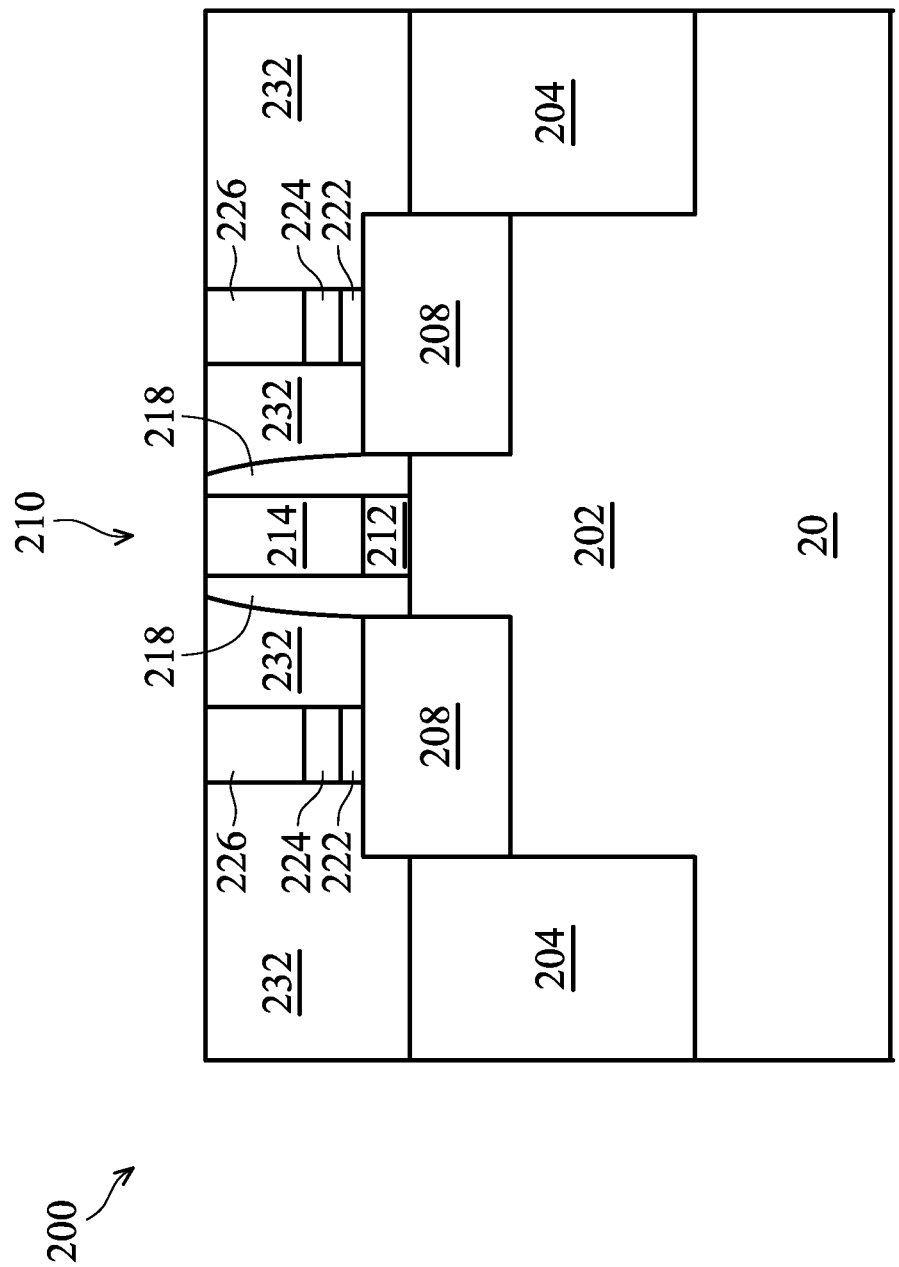
Figure 11:
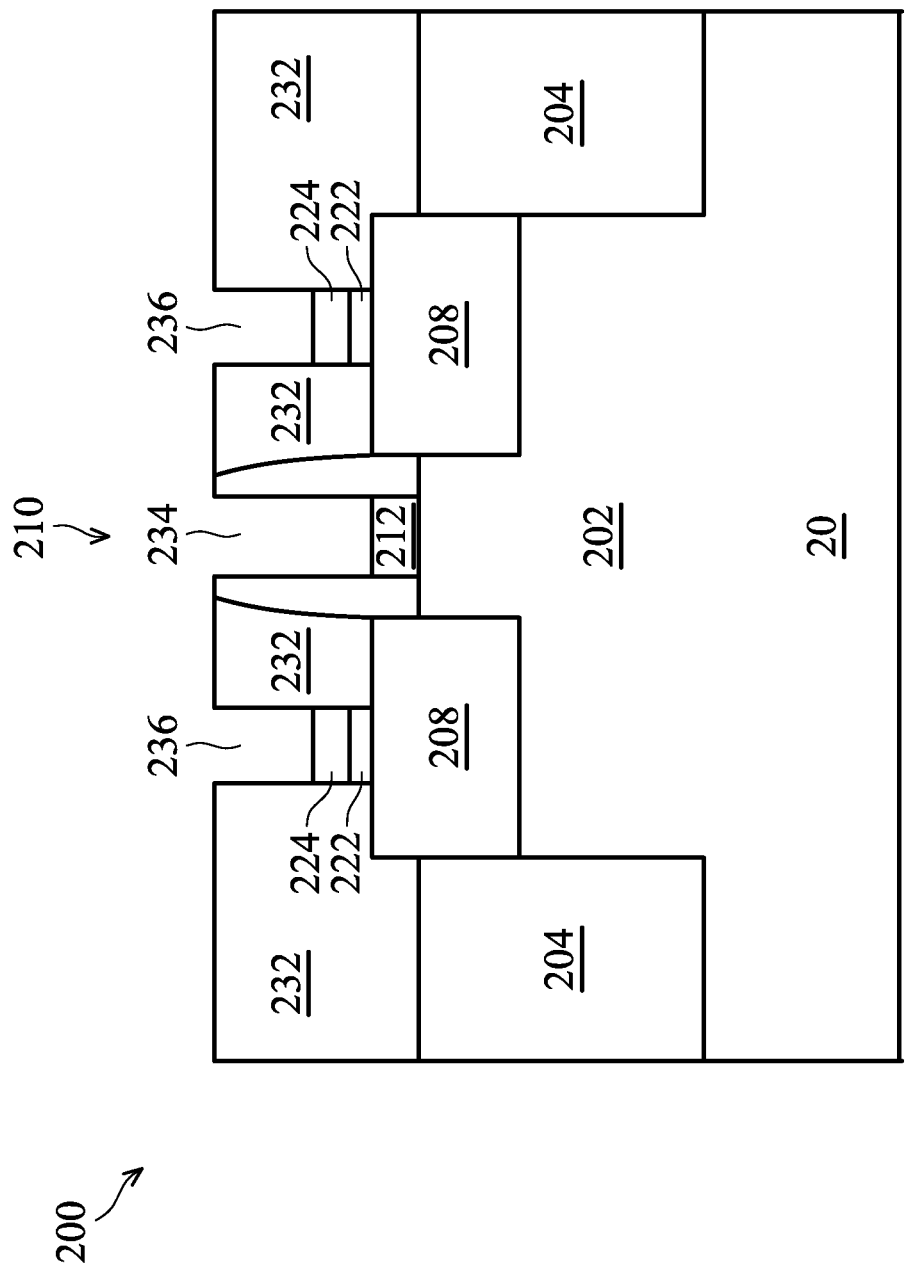

FIG. 11 shows the semiconductor device 200 of FIG. 10 after the dummy gate electrode layer 214 is removed from the dummy gate stack 210 to form an opening 234 in the pair of sidewall spacers 218, while removal of the dummy poly-silicon 226 over the conductive dielectric layer 224 forms an opening 236 in the ILD layer 232 (step 114 in FIG. 1). The dummy gate electrode layer 214 and dummy poly-silicon 226 may be removed using a wet etch and/or a dry etch process. In one embodiment, the wet etch process for dummy poly-silicon gate electrode layer 214 and dummy poly-silicon 226 includes exposure to a hydroxide solution containing ammonium hydroxide, diluted HF, deionized water, and/or other suitable etchant solutions. In other embodiment, the dry etch process for dummy poly-silicon gate electrode layer 214 and dummy poly-silicon 226 may be performed under a source power of about 650 to 800 W, a bias power of about 100 to 120 W, and a pressure of about 60 to 200 mTorr, using $Cl_2$, HBr and He as etching gases.

Figure 12:
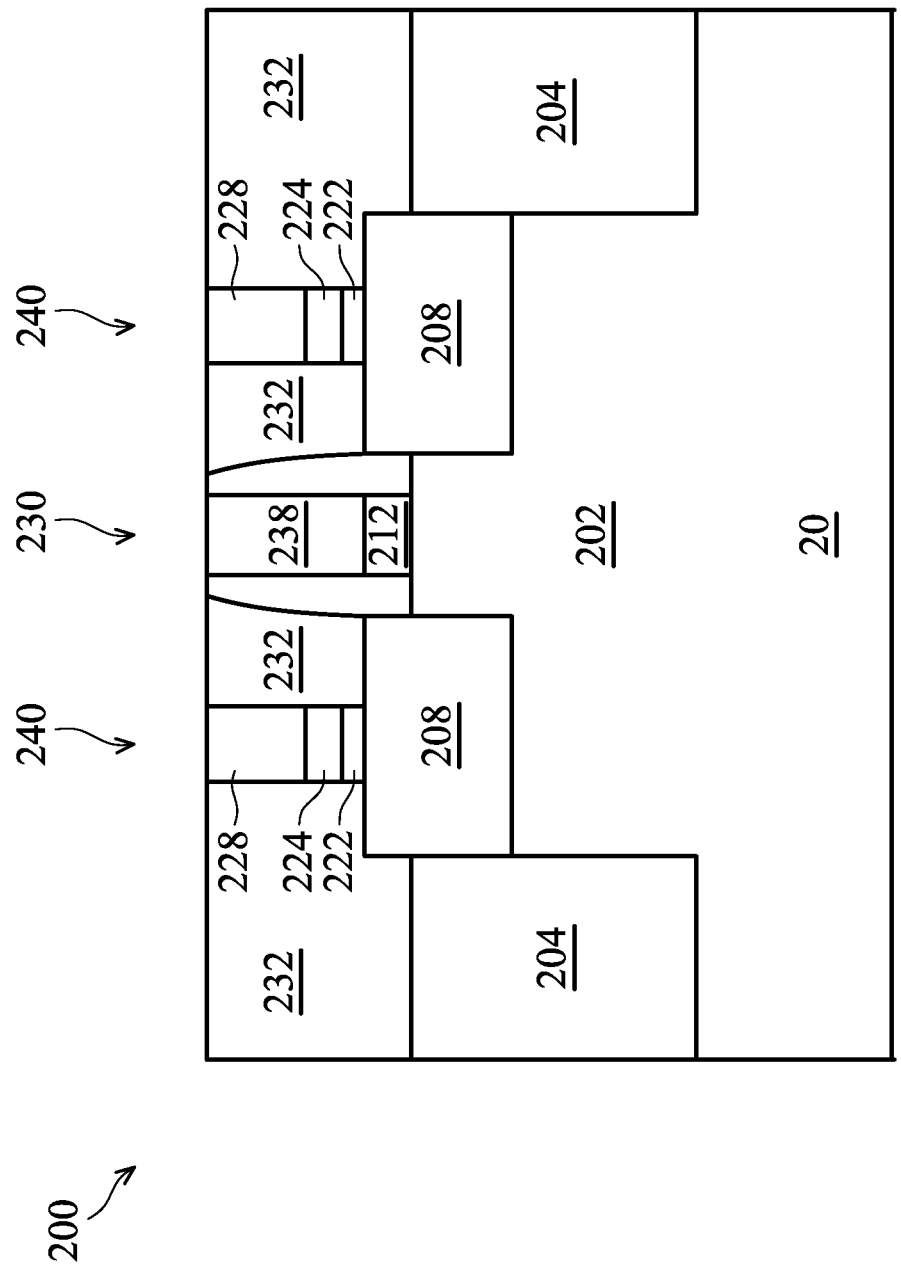

Referring to FIG. 12 and step 116 in FIG. 1, a second metal layer 228 fills the opening 236 to form a portion of a contact structure 240, while a metal gate electrode layer 238 fills the opening 234 to form a portion of a gate stack 230. In some embodiments, the second metal layer 228 comprises Al, Ni, NiPt, or Pt. In some embodiments, the metal gate electrode layer 238 comprises Al, Cu, TiN, TiAlN, TiCN, TaN, TaCN, WN, or WCN. In one embodiment, the second metal layer 228 may be formed before the metal gate electrode layer 238. In other embodiment, the second metal layer 228 may be formed after the metal gate electrode layer 238. In another embodiment, the second metal layer 228 may be formed simultaneously with the metal gate electrode layer 238.

In some embodiments, the metal gate electrode layer 238 and the gate dielectric layer 212 are combined and referred to the gate stack 230. In the depicted embodiment, the strained material 208, first metal layer 222, dielectric layer 224, and second metal layer 228 are combined and referred as the contact structure 240. The contact structure 240 may provide a low-resistance path for interconnection and deliver sufficient amount of strain into channel region of the semiconductor device, thus upgrading the device performance.

After the steps shown in FIG. 1, as further illustrated with respect to the example depicted in FIGS. 2-12, have been performed, subsequent processes, comprising interconnect processing, are typically performed to complete the semiconductor device 200 fabrication.

An aspect of this description relates to a method of fabricating a semiconductor device, the method comprising epitaxially-growing a strained material in a cavity of a substrate comprising a major surface and the cavity, the cavity being below the major surface. A lattice constant of the strained material is different from a lattice constant of the substrate. The method also comprises forming a first metal layer over the strained material, and forming a dielectric layer over the first metal layer, wherein the dielectric layer has a thickness ranging from 1 nm to 10 nm. The method further comprises forming a dummy poly-silicon over the dielectric layer, and forming an interlayered dielectric layer (ILD) surrounding the dummy poly-silicon. The method additionally comprises removing the dummy poly-silicon over the dielectric layer, and forming a second metal layer over the dielectric layer.

Another aspect of this description relates to a method of forming a contact structure for a semiconductor device, the method comprising epitaxially-growing a strained material in a cavity of a substrate comprising a major surface and the cavity, the cavity being below the major surface, wherein a lattice constant of the strained material is different from a lattice constant of the substrate, and the strained material extends upward over the major surface of the substrate. The method also comprises forming a first metal layer over the strained material. The method further comprises forming a dielectric layer over the first metal layer, wherein the dielectric layer has a thickness ranging from 1 nm to 10 nm. The method additionally comprises forming a second metal layer over the dielectric layer.

Still another aspect of this description relates to a method of forming a metal oxide semiconductor field effect transistor (MOSFET), the method comprising forming a gate stack on a major surface of a substrate, the substrate comprising the major surface and a cavity, the cavity having a bottom surface lower than the major surface. The method also comprises forming a shallow trench isolation (STI) region within the substrate, the cavity being between the STI region and the gate stack. The method further comprises forming a contact structure, at least partially in the cavity. Forming the contact structure comprises epitaxially-growing a strained material in the cavity, wherein a lattice constant of the strained material is different from a lattice constant of the substrate, and the strained material extends upward over the major surface of the substrate. Forming the contact structure also comprises forming a first metal layer over the strained material. Forming the contact structure further comprises forming a dielectric layer over the first metal layer, wherein the dielectric layer has a thickness ranging from 1 nm to 10 nm. Forming the contact structure additionally comprises forming a second metal layer over the dielectric layer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a contact structure for a semiconductor device, the method comprising:
  epitaxially-growing a strained material in a cavity of a substrate comprising a major surface and the cavity, the cavity being below the major surface, wherein a lattice constant of the strained material is different from a lattice constant of the substrate, and the strained material extends upward over the major surface of the substrate;
forming a first metal layer over the strained material;
forming a dielectric layer over the first metal layer, wherein the dielectric layer has a thickness ranging from 1 nm to 10 nm; and
forming a second metal layer over the dielectric layer.

2. The method of claim 1, wherein the step of forming a first metal layer over the strained material is performed by CVD, ALD, or sputtering.

3. The method of claim 1, wherein the step of forming a dielectric layer over the first metal layer is performed by CVD, ALD or sputtering.

4. The method of claim 1, wherein the strained material comprises SiGe, SiC, or SiP.

5. The method of claim 1, wherein the first metal layer comprises TiN or TaN.

6. The method of claim 1, wherein forming the dielectric layer comprises forming the dielectric layer comprising $TiO_2$, $Al_2O_3$, NiO, or $HfO_2$.

7. The method of claim 1, wherein forming the second metal layer comprises forming the second metal layer comprising Al, Cu, Ni, NiPt, Pt, Ti, TiAlN, TiCN, TaN, TaCN, WN, or WCN.

8. The method of claim 1, wherein epitaxially-growing the strained material in the cavity of the substrate comprises growing the strained material comprising a dislocation.

9. The method of claim 1, wherein epitaxially-growing the strained material in the cavity of the substrate comprises using a LPCVD process at a temperature ranging from about 400 degrees Celsius to 800 degrees Celsius.

10. The method of claim 9, wherein the LPCVD process is performed at a pressure ranging from about 1 Torr to 15 Torr.

11. The method of claim 10, wherein the pressure is caused using a reaction gas comprising $SiH_2Cl_2$, HCl, $GeH_4$, $B_2H_6$, and $H_2$.

12. A method of forming a metal oxide semiconductor field effect transistor (MOSFET), the method comprising:

forming a gate stack on a major surface of a substrate, the substrate comprising the major surface and a cavity, the cavity having a bottom surface lower than the major surface;
forming a shallow trench isolation (STI) region within the substrate, the cavity being between the STI region and the gate stack; and
forming a contact structure, at least partially in the cavity, wherein forming the contact structure comprises:
epitaxially-growing a strained material in the cavity, wherein a lattice constant of the strained material is different from a lattice constant of the substrate, and the strained material extends upward over the major surface of the substrate;
forming a first metal layer over the strained material;
forming a dielectric layer over the first metal layer, wherein the dielectric layer has a thickness ranging from 1 nm to 10 nm; and
forming a second metal layer over the dielectric layer.

13. The method of claim 12, wherein the step of forming a first metal layer over the strained material is performed by CVD, ALD, or sputtering.

14. The method of claim 12, wherein the step of forming a dielectric layer over the first metal layer is performed by CVD, ALD or sputtering.

15. The method of claim 12, wherein the strained material comprises SiGe, SiC, or SiP.

16. The method of claim 12, wherein the first metal layer comprises TiN or TaN.

17. The method of claim 12, wherein forming the second metal layer comprises forming the second metal layer comprising Al, Cu, Ni, NiPt, Pt, Ti, TiAlN, TiCN, TaN, TaCN, WN, or WCN.

18. The method of claim 12, wherein epitaxially-growing the strained material in the cavity of the substrate comprises using a LPCVD process at a pressure ranging from about 1 Torr to 15 Torr.

19. The method of claim 18, wherein LPCVD process uses a reaction gas comprising $SiH_2Cl_2$ and HCl.

20. The method of claim 19, wherein a mass flow rate of $SiH_2Cl_2$ to a mass flow rate of HCl ranges from 0.45 to 0.55.

* * * * *